(12) United States Patent
Su et al.

(10) Patent No.: US 12,274,094 B2
(45) Date of Patent: Apr. 8, 2025

(54) GATE DRIVING CIRCUIT AND MANUFACTURING METHOD THEREFOR, ARRAY SUBSTRATE, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Tongshang Su, Beijing (CN); Jun Cheng, Beijing (CN); Bin Zhou, Beijing (CN); Ce Zhao, Beijing (CN); Qinghe Wang, Beijing (CN); Jun Wang, Beijing (CN); Liangchen Yan, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 153 days.

(21) Appl. No.: 17/801,003

(22) PCT Filed: Oct. 12, 2021

(86) PCT No.: PCT/CN2021/123296
§ 371 (c)(1),
(2) Date: Aug. 19, 2022

(87) PCT Pub. No.: WO2022/111086
PCT Pub. Date: Jun. 2, 2022

(65) Prior Publication Data
US 2023/0086999 A1    Mar. 23, 2023

(30) Foreign Application Priority Data
Nov. 27, 2020    (CN) .......................... 202011356542.4

(51) Int. Cl.
*H01L 27/12* (2006.01)
*G09G 3/20* (2006.01)
(Continued)

(52) U.S. Cl.
CPC ............... *H10D 86/60* (2025.01); *G09G 3/20* (2013.01); *H10D 86/0221* (2025.01);
(Continued)

(58) Field of Classification Search
CPC . H01L 27/124; H01L 27/127; H01L 27/1214; H01L 27/1218; H01L 29/78633;
(Continued)

(56) References Cited

U.S. PATENT DOCUMENTS

2016/0204136 A1*    7/2016    Takeuchi .......... H01L 29/78648
257/43
2017/0148920 A1    5/2017    Zhang et al.
(Continued)

FOREIGN PATENT DOCUMENTS

CN    202487125 U    10/2012
CN    105140291 A    12/2015
(Continued)

OTHER PUBLICATIONS

CN202011356542.4 second office action.
CN202011356542.4 first office action.
CN202011356542.4 third office action.

*Primary Examiner* — David D Davis
(74) *Attorney, Agent, or Firm* — IPro, PLLC

(57) ABSTRACT

Provided is a gate driving circuit. The gate driving circuit includes a plurality of first transistors; wherein at least one first target transistor of the plurality of first transistors includes a first light-shielding layer disposed on a side of a base substrate, the first light-shielding layer being made of a conductive material; and a first gate metal layer and a first (Continued)

source/drain metal layer disposed on a side of the first light-shielding layer away from the base substrate; wherein the first light-shielding layer is connected to the first gate metal layer.

16 Claims, 9 Drawing Sheets

(51) Int. Cl.
*H10D 86/01* (2025.01)
*H10D 86/40* (2025.01)
*H10D 86/60* (2025.01)

(52) U.S. Cl.
CPC ... *H10D 86/441* (2025.01); *G09G 2300/0408* (2013.01); *G09G 2310/0267* (2013.01); *G09G 2310/0275* (2013.01); *G09G 2330/021* (2013.01)

(58) Field of Classification Search
CPC ....... H01L 29/78; H01L 29/1033; G09G 3/20; G09G 2300/0408; G09G 2310/0267; G09G 2310/0275; G09G 2330/021; G09G 2300/0426; G09G 2310/0286; G09G 2310/08; G09G 3/3266; G09G 3/3677; G02F 1/13454; H10K 59/12
See application file for complete search history.

(56) References Cited

U.S. PATENT DOCUMENTS

| | | | |
|---|---|---|---|
| 2018/0210299 A1 | 7/2018 | Mochizuki et al. | |
| 2020/0044092 A1* | 2/2020 | Feng | H01L 29/7869 |
| 2020/0105789 A1 | 4/2020 | Fang et al. | |
| 2020/0211477 A1* | 7/2020 | Lai | G09G 3/3258 |
| 2021/0408192 A1 | 12/2021 | Zhang et al. | |
| 2022/0238080 A1 | 7/2022 | Xi et al. | |

FOREIGN PATENT DOCUMENTS

| | | | | |
|---|---|---|---|---|
| CN | 108831403 A | | 11/2018 | |
| CN | 109300917 A | | 2/2019 | |
| CN | 109326609 A | | 2/2019 | |
| CN | 110415662 A | * | 11/2019 | ........... G09G 3/3677 |
| CN | 111192884 A | | 5/2020 | |
| CN | 210805780 U | | 6/2020 | |
| CN | 112037728 A | | 12/2020 | |
| CN | 112466948 A | | 3/2021 | |
| KR | 20060069186 A | | 6/2006 | |

* cited by examiner

GATE DRIVING CIRCUIT AND MANUFACTURING METHOD THEREFOR, ARRAY SUBSTRATE, AND DISPLAY DEVICE

CROSS-REFERENCE TO RELATED APPLICATION

The present disclosure is a U.S. national stage of international application No. PCT/CN2021/123296, filed on Oct. 12, 2021, which claims priority to Chinese Patent Application No. 202011356542.4, filed on Nov. 27, 2020 and entitled "GATE DRIVING CIRCUIT AND MANUFACTURING METHOD THEREFOR, ARRAY SUBSTRATE, AND DISPLAY DEVICE", the contents of which are incorporated herein by reference in their entirety.

TECHNICAL FIELD

The present disclosure relates to the field of display technologies, and particularly relates to a gate driving circuit and a manufacturing method therefore, an array substrate and a display device.

BACKGROUND

A gate driving circuit is one of the essential circuits for driving a display panel to display normally, and in order to achieve a narrow frame, the gate driver on array (GOA) technology is generally adopted to integrate the gate driving circuit on an array substrate. Therefore, the gate driving circuit may also be referred to as a GOA circuit.

SUMMARY

The present disclosure provides a gate driving circuit and a manufacturing method therefore, an array substrate and a display device. The technical solutions are as follows.

According to some embodiments of the present disclosure, a gate driving circuit is provided. The gate driving circuit includes: a plurality of first transistors; wherein at least one first target transistor of the plurality of first transistors includes:
  a first light-shielding layer disposed on a side of a base substrate, the first light-shielding layer being made of a conductive material; and
  a first gate metal layer and a first source/drain metal layer disposed on a side of the first light-shielding layer away from the base substrate;
  wherein the first light-shielding layer is connected to the first gate metal layer.

Optionally, the conductive material is a metal material.

Optionally, a thickness of the first light-shielding layer is greater than a thickness threshold.

Optionally, the plurality of first transistors include: an input transistor, a reset transistor, a first output transistor, a second output transistor, a first pull-down control transistor, a second pull-down control transistor, a third pull-down control transistor, a fourth pull-down control transistor, a fifth pull-down control transistor, a first pull-down transistor, a second pull-down transistor, a third pull-down transistor, and a fourth pull-down transistor; wherein
  a gate and a first electrode of the input transistor are connected to an input terminal, and a second electrode of the input transistor is connected to a pull-up node;
  a gate of the first output transistor is connected to the pull-up node, a first electrode of the first output transistor is connected to a first clock signal terminal, and a second electrode of the first output transistor is connected to a shift output terminal;
  a gate of the second output transistor is connected to the pull-up node, a first electrode of the second output transistor is connected to a second clock signal terminal, and a second electrode of the second output transistor is connected to a driving output terminal;
  a gate of the reset transistor is connected to a reset signal terminal, a first electrode of the reset transistor is connected to a first pull-down power supply terminal, and a second electrode of the reset transistor is connected to the pull-up node;
  a gate and a first electrode of the first pull-down control transistor are both connected to a pull-down control power supply terminal, and a second electrode of the first pull-down control transistor is connected to a gate of the second pull-down control transistor;
  a first electrode of the second pull-down control transistor is connected to the pull-down control power supply terminal, and a second electrode of the second pull-down control transistor is connected to a pull-down node;
  a gate of the third pull-down control transistor and a gate of the fourth pull-down control transistor are both connected to the pull-up node, and a first electrode of the third pull-down control transistor and a first electrode of the fourth pull-down control transistor are both connected to the first pull-down power supply terminal, a second electrode of the third pull-down control transistor is connected to the gate of the second pull-down control transistor, and a second electrode of the fourth pull-down control transistor is connected to the pull-down node;
  a gate of the fifth pull-down control transistor is connected to a shift output terminal of another cascaded gate driving circuit, a first electrode of the fifth pull-down control transistor is connected to the first pull-down power supply terminal, and a second electrode of the fifth pull-down control transistor is connected to the pull-down node;
  a gate of the first pull-down transistor, a gate of the second pull-down transistor and a gate of the third pull-down transistor are all connected to the pull-down node, a first electrode of the first pull-down transistor and a first electrode of the second pull-down transistor are both connected to the first pull-down power supply terminal, a first electrode of the third pull-down transistor is connected to a second pull-down power supply terminal, a second electrode of the first pull-down transistor is connected to the pull-up node, a second electrode of the second pull-down transistor is connected to the shift output terminal, and a second electrode of the third pull-down transistor is connected to the driving output terminal; and
  a gate of the fourth pull-down transistor is connected to a shift output terminal of another gate driving circuit, a first electrode of the fourth pull-down transistor is connected to the first pull-down power supply terminal, and a second electrode of the fourth pull-down transistor is connected to the pull-up node.

Optionally, the at least one first target transistor includes: the second output transistor, the second pull-down transistor and/or the third pull-down transistor.

Optionally, the at least one first target transistor further includes: an active layer and a gate insulating layer; wherein the active layer, the gate insulating layer, the first gate metal layer and the first source/drain metal layer are sequentially laminated along a direction away from the first light-shielding layer.

Optionally, an orthographic projection of the first light-shielding layer on the base substrate covers an orthographic projection of the active layer on the base substrate.

Optionally, the at least one first target transistor further includes: a buffer layer, an interlayer dielectric layer and a passivation layer; wherein the buffer layer is disposed between the first light-shielding layer and the active layer;

the interlayer dielectric layer is disposed between the first source/drain metal layer and the first gate metal layer; and the passivation layer is disposed on a side of the first source/drain metal layer away from the interlayer dielectric layer.

Optionally, the passivation layer, the buffer layer and the interlayer dielectric layer are provided with a first via hole therein; the passivation layer and the interlayer dielectric layer are further provided with a second via hole therein; and the at least one first target transistor further includes: a first connection portion; wherein the first connection portion is connected to the first light-shielding layer through the first via hole, and is connected to the first gate metal layer through the second via hole.

Optionally, the active layer includes a first conductive region and a second conductive region; the interlayer dielectric layer is provided with a third via hole and a fourth via hole therein; the first source/drain metal layer includes a first source pattern and a first drain pattern; and the at least one first target transistor further includes: a second connection portion and a third connection portion; wherein one end of the second connection portion is connected to the first source pattern, and the other end of the second connection portion is connected to the first conductive region through the third via hole; and one end of the third connection portion is connected to the first drain pattern, and the other end of the third connection portion is connected to the second conductive region through the fourth via hole.

According to some embodiments of the present disclosure, a method for manufacturing a gate driving circuit is provided. The method includes:

forming a first light-shielding layer on a side of a base substrate by using a conductive material, and forming a first gate metal layer and a first source/drain metal layer on a side of the first light-shielding layer away from the base substrate;

wherein the first light-shielding layer is connected to the first gate metal layer.

Optionally, the method further includes:

forming a buffer layer, an active layer and a gate insulating layer sequentially on the side of the first light-shielding layer away from the base substrate, prior to forming the first gate metal layer on the side of the first light-shielding layer away from the base substrate;

forming an interlayer dielectric layer on a side of the first gate metal layer away from the base substrate, after forming the first gate metal layer on the side of the first light-shielding layer away from the base substrate;

forming a passivation layer on a side of the first source/drain metal layer away from the interlayer dielectric layer, after forming the first source/drain metal layer on the side of the first light-shielding layer away from the base substrate;

forming a first via hole exposing the first light-shielding layer in the passivation layer, the interlayer dielectric layer and the buffer layer;

forming a second via hole exposing the first gate metal layer in the passivation layer and the interlayer dielectric layer; and forming a first connection portion on a side of the passivation layer away from the base substrate, wherein the first connection portion is connected to the first light-shielding layer through the first via hole, and is connected to the first gate metal layer through the second via hole.

In still another aspect, an array substrate is provided. The array substrate includes:

a base substrate, provided with a display region and a non-display region surrounding the display region;

a gate driving circuit disposed in the non-display region, the gate driving circuit being the gate driving circuit described in the above aspect; and a plurality of pixel circuits disposed in the display region; wherein each of the pixel circuits includes a plurality of second transistors, and at least one second target transistor in the plurality of second transistors includes: a second light-shielding layer, a second gate metal layer and a second source/drain metal layer sequentially laminated on a side of the base substrate, wherein the second light-shielding layer is made of a conductive material, and the second source/drain metal layer includes a second source pattern and a second drain pattern, the second light-shielding layer being connected to the second source pattern.

Optionally, the plurality of second transistors include: a switch transistor and a drive transistor; wherein the at least one second target transistor includes the drive transistor.

According to some embodiments of the present disclosure, a display device is provided. The display device includes: a source driving circuit and the array substrate described in the above aspect; wherein the source driving circuit is connected to a data line in the array substrate, and the source driving circuit is configured to provide a data signal for the data line.

BRIEF DESCRIPTION OF THE DRAWINGS

For clearer descriptions of the technical solutions in embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the inventive concept of the embodiments of the present disclosure, the inventive concept of the embodiments of the present disclosure is described in detail hereinafter with reference to the accompanying drawings and some embodiments.

A display panel generally includes a plurality of pixels arranged in an array, and each pixel includes one pixel circuit and one light-emitting element. The pixel circuit is connected to a gate line, a data line and the light-emitting element, and is configured to drive the light-emitting element to emit light based on a gate driving signal from the gate line and a data signal from the data line. The GOA circuit is connected to the gate line in the display panel and configured to provide the gate driving signal for the gate line. A GOA circuit generally includes a plurality of transistors capable of achieving different functions, such as an input transistor achieving an input function and an output transistor achieving an output function. In addition, each transistor in the GOA circuit includes a gate metal layer and a source/drain metal layer.

However, due to the short-channel effect, the threshold voltage Vth of each transistor in the GOA circuit undergoes a severe negative drift. In addition, in order to reliably drive the light-emitting element to emit light, generally each transistor in the GOA circuit needs to have a relatively large on-state current Ion. As such, the size, such as the width-to-length ratio (W/L) of each transistor in the GOA circuit needs to be set larger, and the width-to-length ratio (W/L) is generally 2000/6, which is not conducive to achieving a narrow frame of the display device.

In order to solve the above-mentioned technical problems, some embodiments of the present disclosure provide a new gate driving circuit. The gate driving circuit includes a plurality of first transistors, and at least one first target transistor includes a first light-shielding layer connected to the first gate metal layer. With this arrangement, the negative drift of the first target transistor is effectively solved, and the design of the gate driving circuit is conducive to achieving a narrow frame of the display device.

Figure 1:
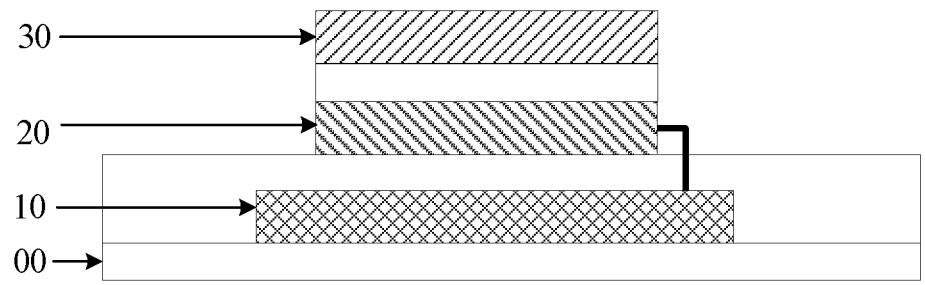
FIG. 1 is a structural schematic diagram of a first target transistor in a gate driving circuit according to some embodiments of the present disclosure.

By taking one first target transistor as an example, FIG. 1 is a structural schematic diagram of a first target transistor according to some embodiments of the present disclosure. As shown in FIG. 1, the first target transistor includes: a first light-shielding (LS) layer 10 disposed on a side of a base substrate 00, and a first gate metal layer 20 and a first source/drain metal layer 30 which are disposed on the side of the first light-shielding layer 10 away from the base substrate 00.

The first light-shielding layer 10 is made of a conductive material, and the first light-shielding layer 10 is connected to the first gate metal layer 20. In this way, it is considered that the first target transistor has a double-gate structure, and one upper conductive channel and one lower conductive channel are formed, such that the threshold voltage Vth of the first target transistor can be drifted positively, that is, the negative drift of the first target transistor can be effectively suppressed. On the premise of the positive drift of Vth, the on-state current Ion of the first target transistor also increases accordingly. It's known that the calculation formula of the on-state current Ion is:

Ion=$W*\mu_n*Cox(Vgs-Vth)^2/L$, where W is a channel width, L is a channel length, $\mu_n$, is a carrier mobility of the first target transistor, and Cox is capacitance of a gate insulating layer of the first target transistor.

According to the calculation formula of the on-state current Ion, it can be known that the size of the first target transistor can be correspondingly reduced under the premise that Ion is increased by setting the first light-shielding layer 10 to be connected to the first gate metal layer 20. For example, the channel width W and/or the channel length L of the first target transistor can be reduced.

For example, assuming that when the first light-shielding layer 10 is not provided, the width-to-length ratio W/L of the first target transistor needs to be set as 2000/6 in order to achieve the target on-state current Ion, then after the first light-shielding layer 10 is provided, the above target on-state current Ion can still be achieved while the channel length L is reduced such that the width-to-length ratio W/L changes, for example, from 2000/6 to 2000/5, or the channel width W is reduced such that the width-to-length ratio W/L changes, for example, from 2000/6 to 1500/5. In this way, a foundation is laid for achieving the narrow frame, that is, the narrow frame of the display device is facilitated.

In summary, the embodiments of the present disclosure provide a gate driving circuit. At least one transistor in the gate driving circuit includes a first light-shielding layer made of a conductive material, and the first light-shielding layer is connected to the first gate metal layer of the transistor. Therefore, two conductive channels are formed, and the on-state current is increased, thereby effectively suppressing the negative drift of the threshold voltage.

Figure 2:
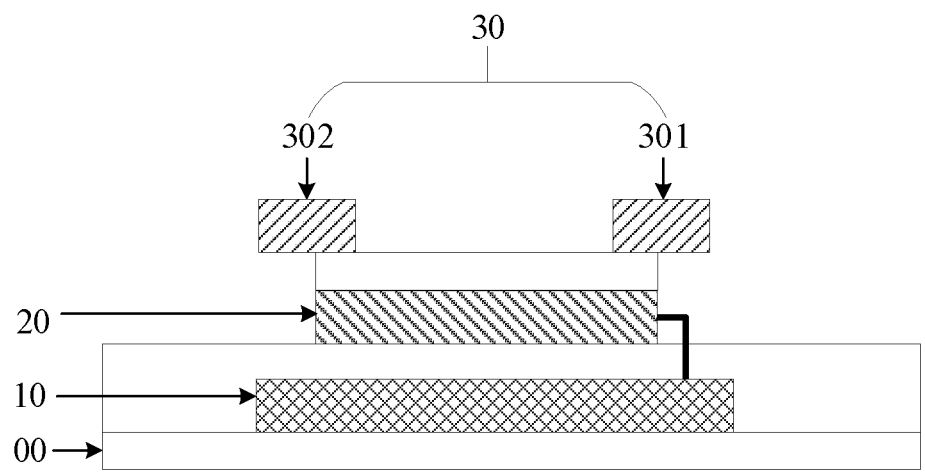
FIG. 2 is a structural schematic diagram of a first target transistor in a gate driving circuit according to some embodiments of the present disclosure.

Optionally, with reference to FIG. 2, in the embodiments of the present disclosure, the first source/drain metal layer 30 includes a first source pattern 301 and a first drain pattern 302.

Figure 3:
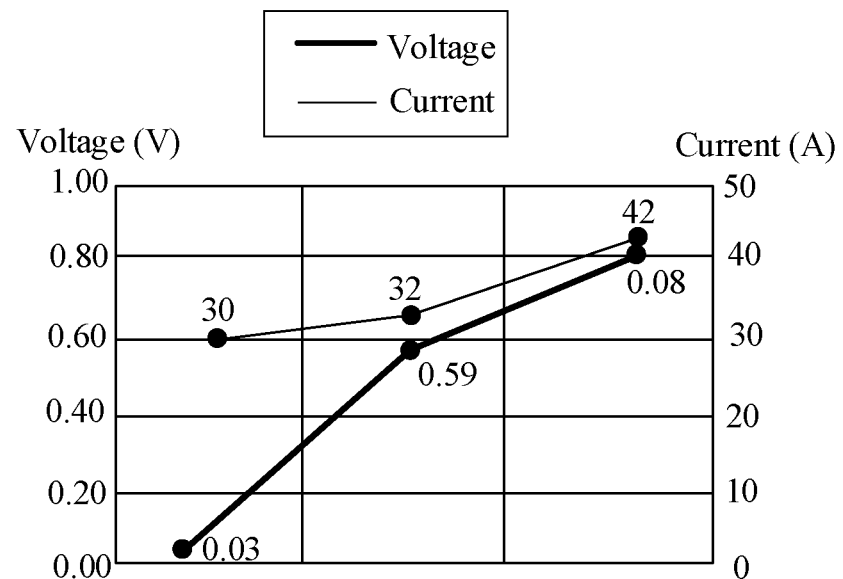
FIG. 3 is a schematic diagram showing a relationship between a threshold voltage and on-state current of a first target transistor according to some embodiments of the present disclosure.

Taking the case where the first light-shielding layer 10 is not provided, the case where the first light-shielding layer 10 is provided to be connected to the first source pattern 301, and the case where the first light-shielding layer 10 is provided to be connected to the first gate metal layer 20 as examples, FIG. 3 shows a schematic diagram showing a relationship between the threshold voltage Vth and on-state current Ion of the first target transistor in the three cases.

As can be seen with reference to FIG. 3, in the case that the first light-shielding layer 10 is provided to be connected to the first source pattern 301, the threshold voltage Vth of the first target transistor is 0.03 volts (V), and the corresponding on-state current Ion is about 30 amps (A); in the case that the first light-shielding layer 10 is not provided, the threshold voltage Vth of the first target transistor is 0.59 V, and the corresponding on-state current Ion is about 32 A; and in the case that the first light-shielding layer 10 is provided to be connected to the first gate metal layer 20, the threshold voltage Vth of the first target transistor is 0.08 V, and the corresponding on-state current Ion is about 42 A. In this way, it can be further determined that, with the arrangement provided in the embodiments of the present disclosure, the degree of negative drift of the threshold voltage Vth of the first target transistor is smaller and the on-state current Ion is larger, in comparison with the case that the first light-shielding layer 10 is not provided or the case that the first light-shielding layer 10 is provided to be connected to the first source pattern 301.

Optionally, the conductive material for making the first light-shielding layer 10 is a metal material. In this way, the first light-shielding layer is also referred to as a first metal light-shielding layer. By setting the metal material as the conductive material, the conductive effect can be reliably ensured, and light can be effectively shielded, thereby solving the problem of negative drift caused by light illumination.

Certainly, the conductive material is also other materials with conductive properties, such as an organic conductive material. The conductive material is not limited in the embodiments of the present disclosure.

Optionally, the thickness of the first light-shielding layer 10 is greater than a thickness threshold. That is, the first light-shielding layer 10 is relatively thick, which can further ensure the light-shielding effect.

Figure 4:
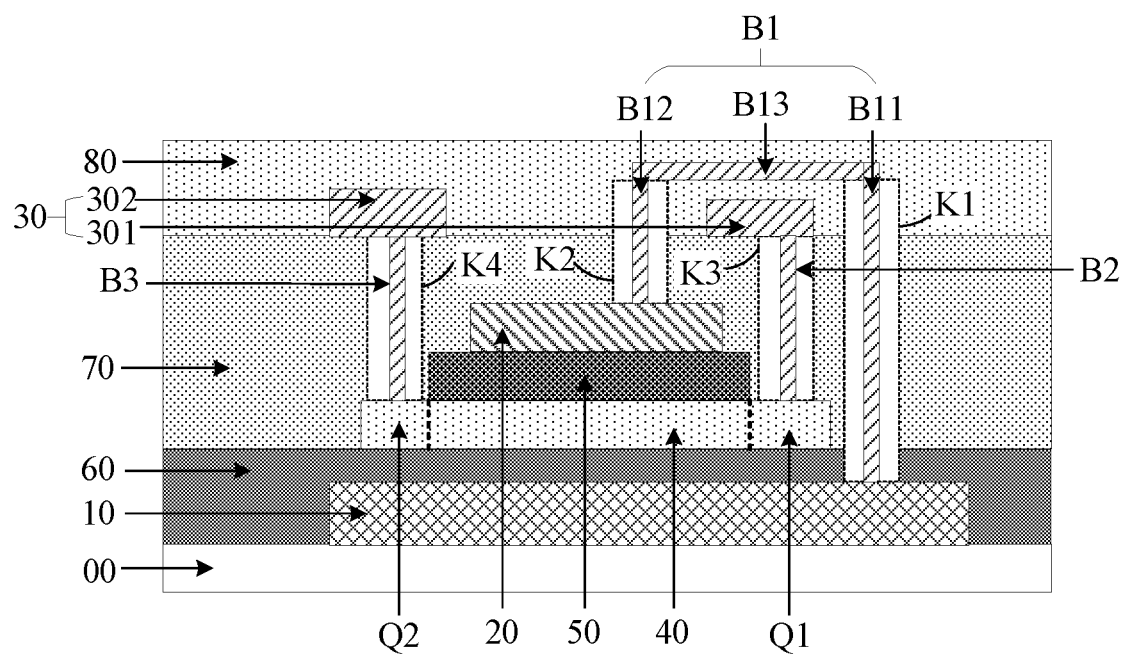
FIG. 4 is a structural schematic diagram of a first target transistor in another gate driving circuit according to some embodiments of the present disclosure.

Optionally, FIG. 4 is a structural schematic diagram of another gate driving circuit according to some embodiments of the present disclosure. As shown in FIG. 4, the first target transistor further includes: an active (ACT) layer 40 and a gate insulating (GI) layer 50.

The active layer 40, the gate insulating layer 50, the first gate metal layer 20 and the first source/drain metal layer 30 are sequentially laminated along the direction away from the first light-shielding layer 10. That is, the first target transistor described in the embodiments of the present disclosure is a transistor with a top-gate structure.

Certainly, the first target transistor is not limited to the top-gate structure. For example, the first target transistor is also a transistor with a bottom-gate structure. In the case that the first target transistor is a transistor with a bottom-gate structure, another metal layer is provided on the side of the first source/drain metal layer 30 away from the base substrate 00, and the first light-shielding layer 10 is arranged to be connected to the added metal layer.

Optionally, referring to FIG. 4, in the embodiments of the present disclosure, the orthographic projection of the first light-shielding layer 10 on the base substrate 00 covers the orthographic projection of the active layer 40 on the base substrate 00. In this way, a better light-shielding effect can be further ensured.

Optionally, still referring to FIG. 4, the first target transistor further includes a buffer layer 60, an interlayer dielectric (ILD) layer 70 and a passivation layer (PVX) 80. The interlayer dielectric layer 70 is also referred to as an interlayer insulating layer.

The buffer layer 60 is disposed between the first light-shielding layer 10 and the active layer 40, the interlayer dielectric layer 70 is disposed between the first source/drain metal layer 30 and the first gate metal layer 20, and the passivation layer 80 is disposed on the side of the first source/drain metal layer 30 away from the interlayer dielectric layer 70.

Optionally, still referring to FIG. 4, the passivation layer 80, the buffer layer 60 and the interlayer dielectric layer 70 are provided with a first via hole K1 therein, and the passivation layer 80 and the interlayer dielectric layer 70 are further provided with a second via hole K2 therein. The first target transistor further includes a first connection portion B1.

The first connection portion B1 is connected to the first light-shielding layer 10 through the first via hole K1, and is connected to the first gate metal layer 20 through the second via hole K2. The first via hole K1 and the second via hole K2 are also referred to as connective (CNT) via holes.

For example, referring to FIG. 4, the first connection portion B1 includes three portions B11, B12 and B13. The first portion B11 is in the first via hole K1 and connected to the first light-shielding layer 10, the second portion B12 is in the second via hole K2 and connected to the first gate metal layer 20, and the third portion B13 is in the passivation layer 80 and connected to the first portion B11 and the second portion B12.

Optionally, with reference to FIG. 2 and FIG. 4, the active layer 40 includes a first conductive region Q1 and a second conductive region Q2. The interlayer dielectric layer 70 is further provided with a third via hole K3 and a fourth via hole K4 therein. The first source/drain metal layer 30 includes a first source pattern 301 and a first drain pattern 302. The first target transistor further includes a second connection portion B2 and a third connection portion B3. The third via hole K3 and the fourth via hole K4 are also referred to as ILD via holes.

One end of the second connection portion B2 is connected to the first source pattern 301, and the other end of the second connection portion B2 is connected to the first conductive region Q1 through the third via hole K3. One end of the third connection portion B3 is connected to the first drain pattern 302, and the other end of the third connection portion B3 is connected to the second conductive region Q2 through the fourth via hole K4

Figure 5:
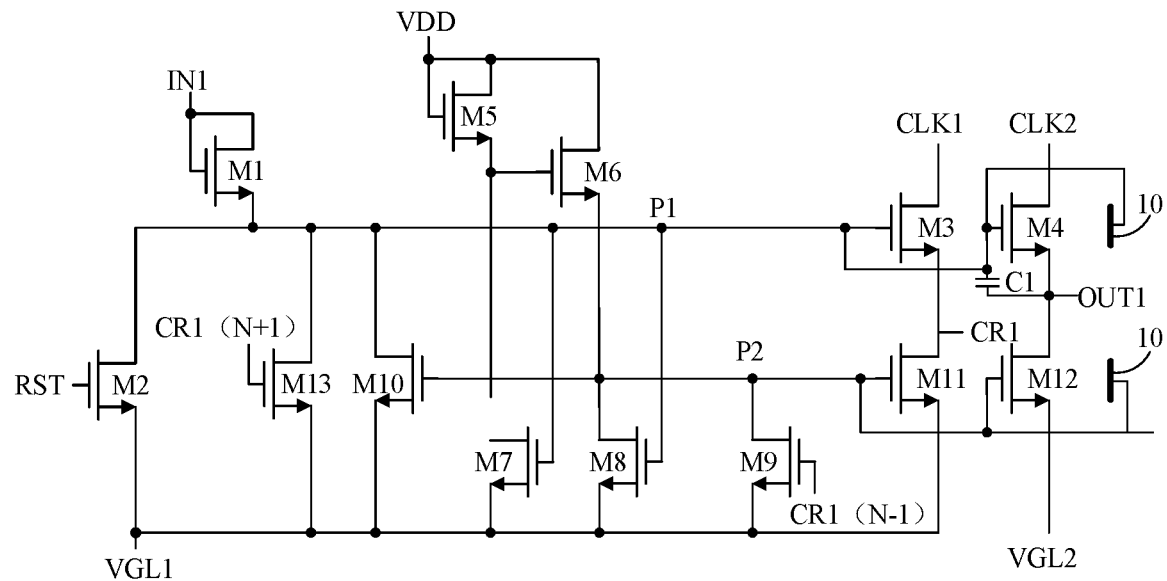
FIG. 5 is a structural schematic diagram of a gate driving circuit according to some embodiments of the present disclosure.

Optionally, FIG. 5 is a structural schematic diagram of still another gate driving circuit according to some embodiments of the present disclosure. As shown in FIG. 5, the plurality of first transistors in the gate driving circuit includes: an input transistor M1, a reset transistor M2, a first output transistor M3, a second output transistor M4, a first pull-down control transistor M5, a second pull-down control transistor M6, a third pull-down control transistor M7, a fourth pull-down control transistor M8, a fifth pull-down control transistor M9, a first pull-down transistor M10, a second pull-down transistor M11, a third pull-down transistor M12, and a fourth pull-down transistor M13.

A gate and a first electrode of the input transistor M1 are connected to an input terminal IN1, and the second electrode of the input transistor M1 is connected to a pull-up node P1.

For example, the input transistor M1 is configured to transmit an input signal to the pull-up node P1 under the control of the input signal provided by the input terminal IN1, to charge the pull-up node P1.

A gate of the first output transistor M3 is connected to the pull-up node P1, a first electrode of the first output transistor M3 is connected to a first clock signal terminal CLK1, and a second electrode of the first output transistor M3 is connected to a shift output terminal CR1. Optionally, the shift output terminal CR1 is connected to the input terminal IN of a next stage of cascaded gate driving circuit, and is configured to drive the next stage of gate driving circuit to work, thereby achieving the shift function. A potential of the input signal is an effective potential.

For example, the first output transistor M3 transmits a first clock signal provided by the first clock signal terminal CLK1 to the shift output terminal CR1 under the control of the potential of the pull-up node P1.

A gate of the second output transistor M4 is connected to the pull-up node P1, a first electrode of the second output transistor M4 is connected to a second clock signal terminal CLK2, and a second electrode of the second output transistor M4 is connected to a driving output terminal OUT1. Optionally, the driving output terminal OUT1 is connected to a gate line in the display panel, and is configured to provide a gate driving signal for the gate line.

For example, the second output transistor M4 transmits a second clock signal provided by the second clock signal terminal CLK2 to the driving output terminal OUT1 under the control of the potential of the pull-up node P1.

A gate of the reset transistor M2 is connected to a reset signal terminal RST, a first electrode of the reset transistor M2 is connected to a first pull-down power supply terminal VGL1, and a second electrode of the reset transistor M2 is connected to the pull-up node P1.

For example, the reset transistor M2 transmits a first pull-down power supply signal provided by the first pull-down power supply terminal VGL1 to the pull-up node P1 under the control of a reset signal provided by the reset signal terminal RST, to reset and reduce noise for the pull-up node P1. The potential of the first pull-down power supply signal is an ineffective potential.

Optionally, in the case that the transistor is an N-type transistor, the ineffective potential is a low potential relative to the effective potential; and in the case that the transistor is a P-type transistor, the ineffective potential is a high potential relative to the effective potential, which is not limited in the embodiments of the present disclosure.

A gate and a first electrode of the first pull-down control transistor M5 are connected to a pull-down control power supply terminal VDD, and a second electrode of the first pull-down control transistor M5 is connected to a gate of the second pull-down control transistor M6.

For example, the first pull-down control transistor M5 transmits a pull-down control power supply signal to the gate of the second pull-down control transistor M6 under the control of the pull-down control power supply signal provided by the pull-down control power supply terminal VDD. The potential of the pull-down control power supply signal is an effective potential.

A first electrode of the second pull-down control transistor M6 is connected to the pull-down control power supply terminal VDD, and a second electrode of the second pull-down control transistor M6 is connected to a pull-down node P2.

For example, the second pull-down control transistor M6 transmits the pull-down control power supply signal to the pull-down node P2 under the control of the pull-down control power supply signal, to control the pull-down node P2.

A gate of the third pull-down control transistor M7 and a gate of the fourth pull-down control transistor M8 are both connected to the pull-up node P1, a first electrode of the third pull-down control transistor M7 and a first electrode of the fourth pull-down control transistor M8 are both connected to the first pull-down power supply terminal VGL1, a second electrode of the third pull-down control transistor M7 is connected to the gate of the second pull-down control transistor M6, and a second electrode of the fourth pull-down control transistor M8 is connected to the pull-down node P2.

For example, the third pull-down control transistor M7 transmits the first pull-down power supply signal to the gate of the second pull-down control transistor M6 under the control of the potential of the pull-up node P1. The fourth pull-down control transistor M8 transmits the first pull-down power supply signal to the pull-down node P2 under the control of the potential of the pull-up node P1, to control the pull-down node P2.

A gate of the fifth pull-down control transistor M9 is connected to a shift output terminal of another cascaded gate driving circuit, a first electrode of the fifth pull-down control transistor M9 is connected to the first pull-down power supply terminal VGL1, and a second electrode of the fifth pull-down control transistor M9 is connected to the pull-down node P2. Optionally, the gate of the fifth pull-down control transistor M9 shown in FIG. 5 is connected to the shift output terminal CR1 (N−1) of the previous cascaded gate driving circuit, where N represents that the current stage is the $N^{th}$ stage, and N is an integer greater than 1.

For example, the fifth pull-down control transistor M9 transmits the first pull-down power supply signal to the pull-down node P2 under the control of the signal provided by the shift output terminal of another cascaded gate driving circuit, to control the pull-down node P2.

A gate of the first pull-down transistor M10, a gate of the second pull-down transistor M11 and a gate of the third pull-down transistor M12 are all connected to the pull-down node P2, a first electrode of the first pull-down transistor M10 and a first electrode of the second pull-down transistor M11 are both connected to the first pull-down power supply terminal VGL1, a first electrode of the third pull-down transistor M12 is connected to the second pull-down power supply terminal VGL2, a second electrode of the first pull-down transistor M10 is connected to the pull-up node P1, a second electrode of the second pull-down transistor M11 is connected to the shift output terminal CR1, and a second electrode of the third pull-down transistor M12 is connected to the driving output terminal OUT1.

For example, the first pull-down transistor M10 transmits the first pull-down power supply signal to the pull-up node P1 under the control of the potential of the pull-down node P2, to pull down the potential and reduce noise for the pull-up node P1. The second pull-down transistor M11 transmits the first pull-down power supply signal to the shift output terminal CR1 under the control of the potential of the pull-down node P2, to pull down the potential and reduce noise for the shift output terminal CR1. The third pull-down transistor M12 transmits a second pull-down power supply signal provided by the second pull-down power supply terminal VGL2 to the driving output terminal OUT1 under the control of the potential of the pull-down node P2, to pull down the potential and reduce noise for the driving output terminal OUT1. The potential of the second pull-down power supply signal is also an ineffective potential.

A gate of the fourth pull-down transistor M13 is connected to the shift output terminal of another gate driving circuit, a first electrode of the fourth pull-down transistor M13 is connected to the first pull-down power supply terminal VGL1, and a second electrode of the fourth pull-down transistor M13 is connected to the pull-up node P1. Optionally, the gate of the fourth pull-down transistor M13 shown in FIG. 5 is connected to the shift output terminal CR1 (N+1) of a next cascaded gate driving circuit.

For example, the fourth pull-down transistor M13 transmits the first pull-down power supply signal to the pull-up node P1 under the control of a signal provided by the shift output terminal of the another gate driving circuit, to pull down the potential and reduce noise for the pull-up node P1.

Furthermore, referring to FIG. 5, the gate driving circuit further includes a storage capacitor C1. One end of the storage capacitor C1 is connected to the pull-up node P1, and the other end of the storage capacitor C1 is connected to the driving output terminal OUT1.

Optionally, the at least one first target transistor described in the embodiments of the present disclosure includes: the second output transistor M4, the second pull-down transistor M11 and/or the third pull-down transistor M12.

The second output transistor M4 is configured to provide the gate driving signal to the gate line, the second pull-down transistor M11 is configured to pull down the potential and reduce noise for the shift output terminal CR1, and the third pull-down transistor M12 is configured to pull down the potential and reduce noise for the driving output terminal OUT1. Therefore, the on-state current Ion required by each of the second output transistor M4, the second pull-down transistor M11 and the third pull-down transistor M12 is relatively large. Thus, by arranging the first light-shielding layer 10 in at least one of the second output transistor M4, the second pull-down transistor M11 and the third pull-down transistor M12, the negative drift of transistors in the gate driving circuit can be effectively avoided.

For example, referring to FIG. 5, the at least one first target transistor is the second output transistor M4, the second pull-down transistor M11 and the third pull-down transistor M12. It can be seen from FIG. 5 that the first light-shielding layer 10 is connected to the gate of the second output transistor M4, the gate of the second pull-down transistor M11 and the gate of the third pull-down transistor M12.

It should be noted that, the gate driving circuit is not limited to the 13T1C structure (i.e., 13 transistors and 1 capacitor) shown in FIG. 5, and is also of other structures such as 7T1C, which is not limited in the embodiments of the present disclosure. In addition, the first light-shielding layer 10 is also made of an insulating material, and in the case that the first light-shielding layer 10 is made of an insulating material, the first light-shielding layer 10 is not connected to any layer. By arranging the first light-shielding layer 10 made of the insulating material, the stability light illumination can be improved, and the problem of negative drift caused by light illumination can be solved.

In summary, the embodiments of the present disclosure provide a gate driving circuit. At least one transistor in the gate driving circuit includes a first light-shielding layer made of a conductive material, and the first light-shielding layer is connected to the first gate metal layer of the transistor. Therefore, two conductive channels are formed, and the on-state current is increased, thereby effectively suppressing the negative drift of the threshold voltage.

Figure 6:
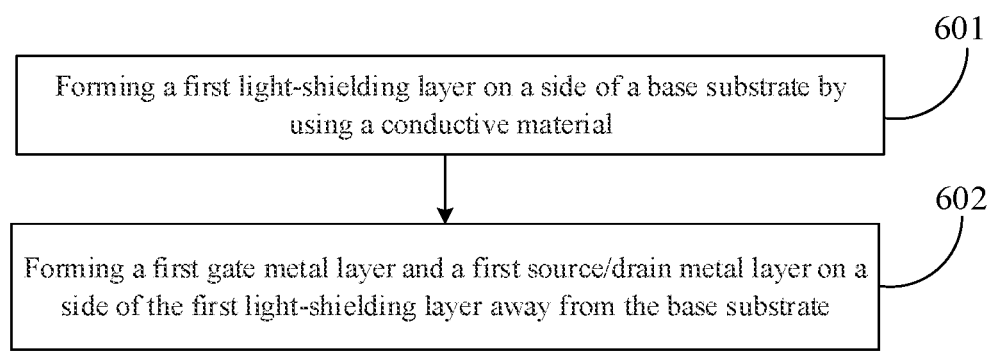
FIG. 6 is a flowchart of a method for manufacturing a gate driving circuit according to some embodiments of the present disclosure.

FIG. 6 is a flowchart of a method for manufacturing a gate driving circuit according to some embodiments of the present disclosure. The method is applied to manufacture the gate driving circuit as shown in FIG. 1, FIG. 2, FIG. 4 or FIG. 5. As shown in FIG. 6, the method includes the following steps.

In step 601, a first light-shielding layer is formed on a side of a base substrate by using a conductive material.

Optionally, the conductive material is a metal material, and the first light-shielding layer is formed on the provided base substrate through a patterning process.

In step 602, a first gate metal layer and a first source/drain metal layer are formed on a side of the first light-shielding layer away from the base substrate.

Subsequently, the first gate metal layer and the first source/drain metal layer are formed on the base substrate on which the first light-shielding layer is formed still through the patterning process, and the first light-shielding layer is arranged to be connected to the first gate metal layer.

In summary, the embodiments of the present disclosure provide a method for manufacturing a gate driving circuit. By providing the first light-shielding layer and arranging the first light-shielding layer to be connected to the first gate metal layer, two conductive channels can be formed, and the on-state current is increased, thereby effectively suppressing the negative drift of the threshold voltage of transistors in the gate driving circuit.

Figure 7:
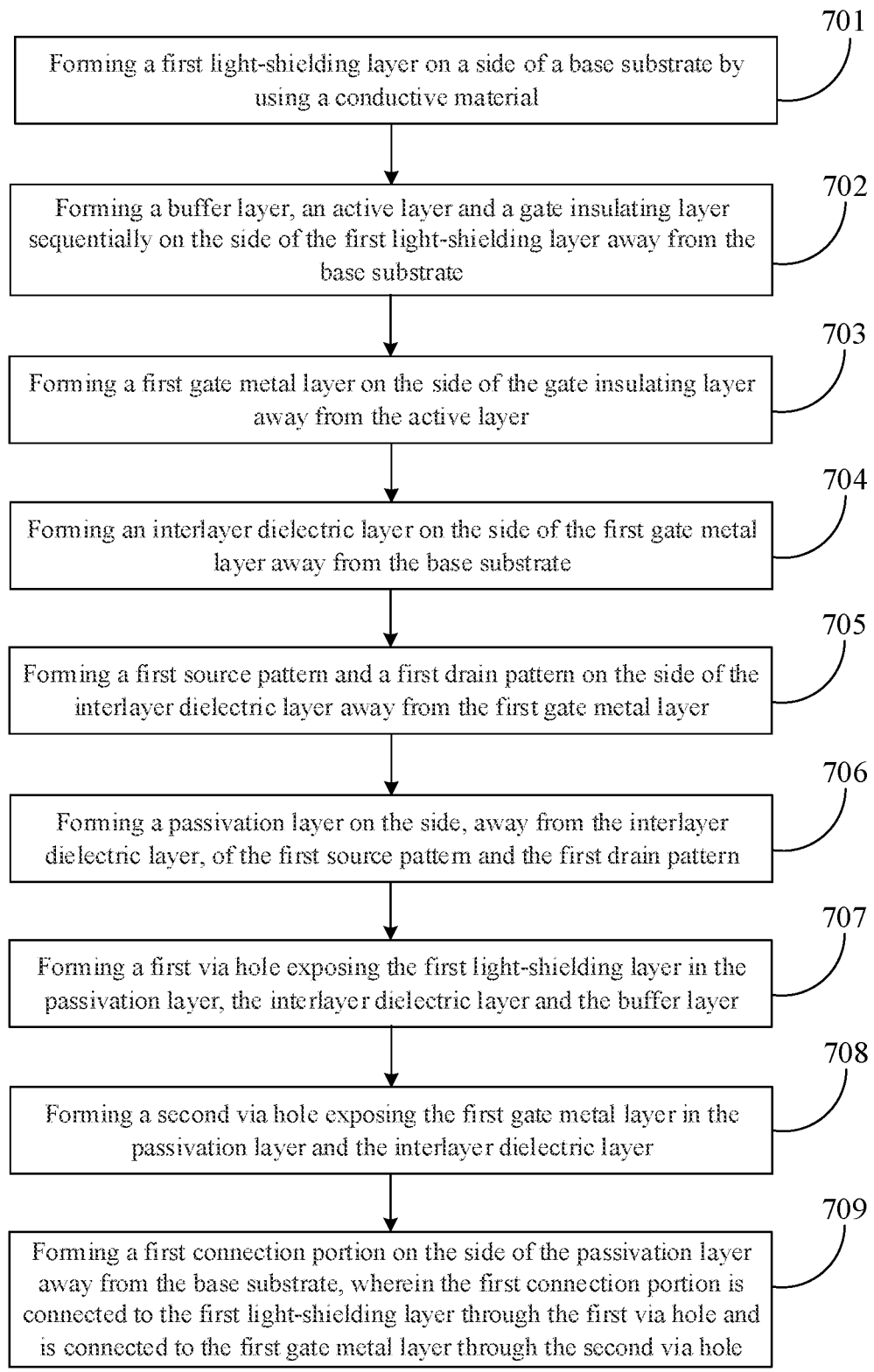
FIG. 7 is a flowchart of another method for manufacturing a gate driving circuit according to some embodiments of the present disclosure.

FIG. 7 is a flowchart of a method for manufacturing a gate driving circuit according to some embodiments of the present disclosure. The method is applied to manufacture the gate driving circuit as shown in FIG. 1, FIG. 2, FIG. 4 or FIG. 5. As shown in FIG. 7, the method includes the following steps.

In step 701, a first light-shielding layer is formed on a side of a base substrate by using a conductive material.

In the embodiments of the present disclosure, the base substrate is provided as a carrier at first, and then the first light-shielding layer is formed on a side of the base substrate through the patterning process. Optionally, the patterning process includes photoresist coating, exposure, developing and etching. The base substrate is a glass substrate or a flexible substrate.

Figure 8:
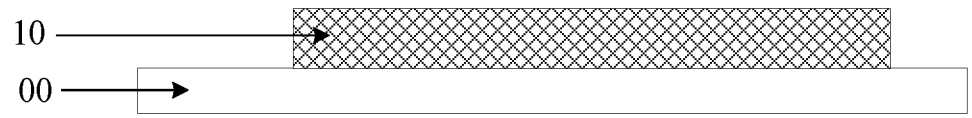
FIG. 8 is a structural schematic diagram of a base substrate formed with a first light-shielding layer according to some embodiments of the present disclosure.

In example embodiments, for the base substrate 00 on which the first light-shielding layer 10 is formed, reference is made to the structure shown in FIG. 8.

In step 702, a buffer layer, an active layer and a gate insulating layer are formed sequentially on the side of the first light-shielding layer away from the base substrate.

After the first light-shielding layer is formed, a buffer layer is deposited on the side of the first light-shielding layer away from the base substrate through a deposition process first. Then, an active layer pattern is deposited on the side of the buffer layer away from the first light-shielding layer through the deposition process, and the active layer pattern is processed through the patterning process to acquire the active layer. Finally, a gate insulating layer pattern is deposited on the side of the active layer away from the buffer layer through the deposition process, and the gate insulating layer pattern is processed through the patterning process (e.g., dry patterning process) to acquire the gate insulating layer. In this way, the buffer layer, the active layer and the gate insulating layer sequentially laminated are acquired.

In addition, after the active layer is formed, conductive treatment is performed on both sides of the active layer to form conductive regions, to facilitate subsequent connection. Optionally, the conductive treatment is performed on the active layer by using plasma doped with helium (He).

Figure 9:
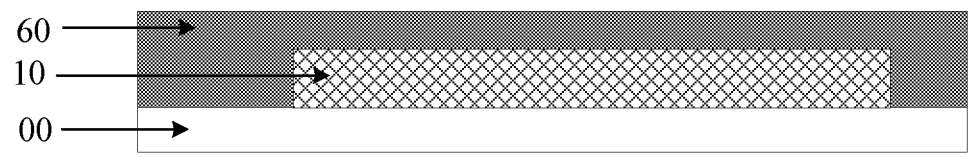
FIG. 9 is a structural schematic diagram of a base substrate formed with a buffer layer according to some embodiments of the present disclosure.
Figure 10:
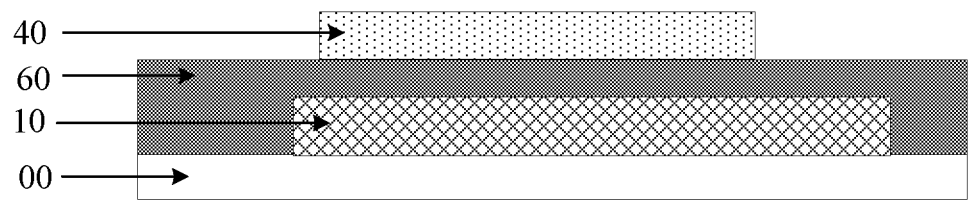
FIG. 10 is a structural schematic diagram of a base substrate formed with an active layer according to some embodiments of the present disclosure.
Figure 11:
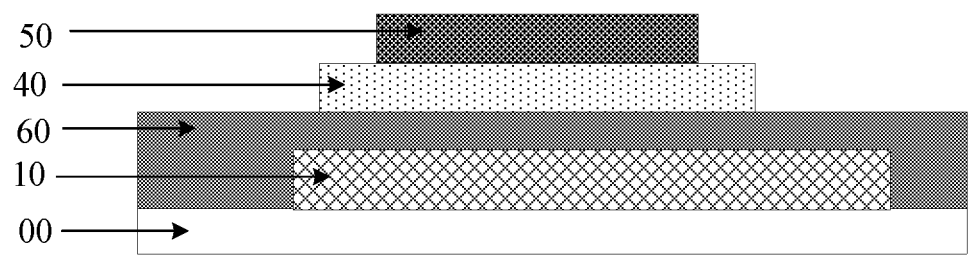
FIG. 11 is a structural schematic diagram of a base substrate formed with a gate insulating layer according to some embodiments of the present disclosure.
Figure 12:
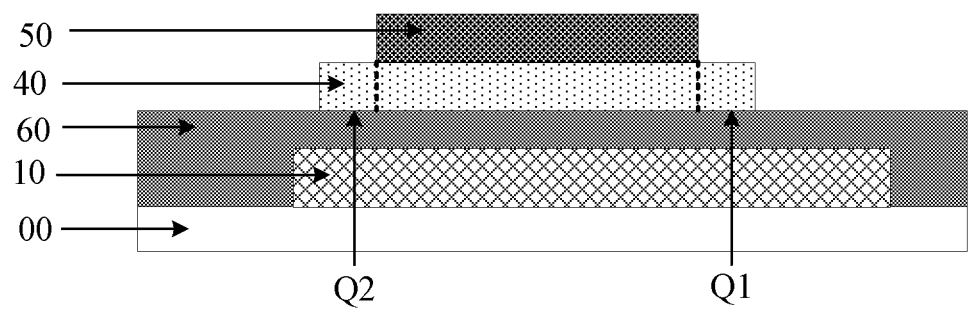
FIG. 12 is a structural schematic diagram of a base substrate formed with a conductive region according to some embodiments of the present disclosure.

In example embodiments, for the base substrate 00 on which the buffer layer 70 is formed, reference is made to the structure shown in FIG. 9. For the base substrate 00 on which the active layer 40 is formed, reference is made to the structure shown in FIG. 10. For the base substrate 00 on which the gate insulating layer 50 is formed, reference is made to the structure shown in FIG. 11. For the base substrate 00 after the conductive treatment is performed on the active layer 40, reference is made to the structure shown in FIG. 12. Referring to FIG. 12, the active layer 40 includes a first conductive region Q1 and a second conductive region Q2.

In step 703, a first gate metal layer is formed on the side of the gate insulating layer away from the active layer.

Optionally, after the gate insulating layer is formed, a gate metal pattern is formed on the side of the gate insulating layer away from the active layer still through the deposition process, and the gate metal pattern is processed through the patterning process (e.g., a wet patterning process) to acquire the first gate metal layer.

Figure 13:
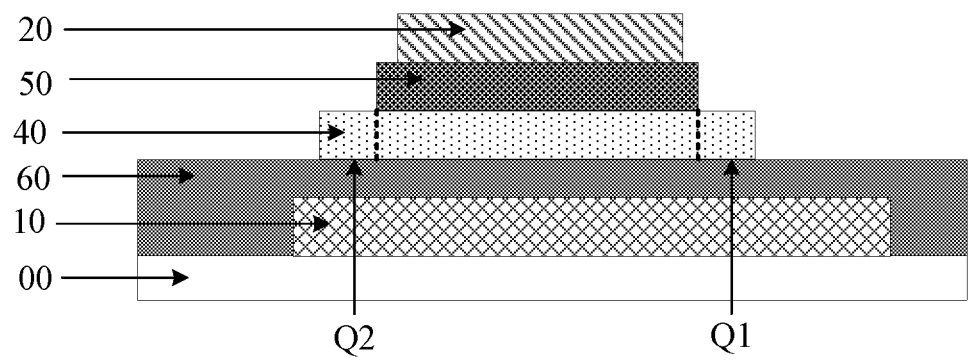
FIG. 13 is a structural schematic diagram of a base substrate formed with a first gate metal layer according to some embodiments of the present disclosure.

In example embodiments, for the base substrate 00 on which the first gate metal layer 20 is formed, reference is made to the structure shown in FIG. 13. The structure shown in FIG. 13 is also referred to as a top gate structure.

In step 704, an interlayer dielectric layer is formed on the side of the first gate metal layer away from the base substrate.

Optionally, after the first gate metal layer is formed, the interlayer dielectric layer is formed on the side of the first gate metal layer away from the base substrate still through the deposition process.

Figure 14:
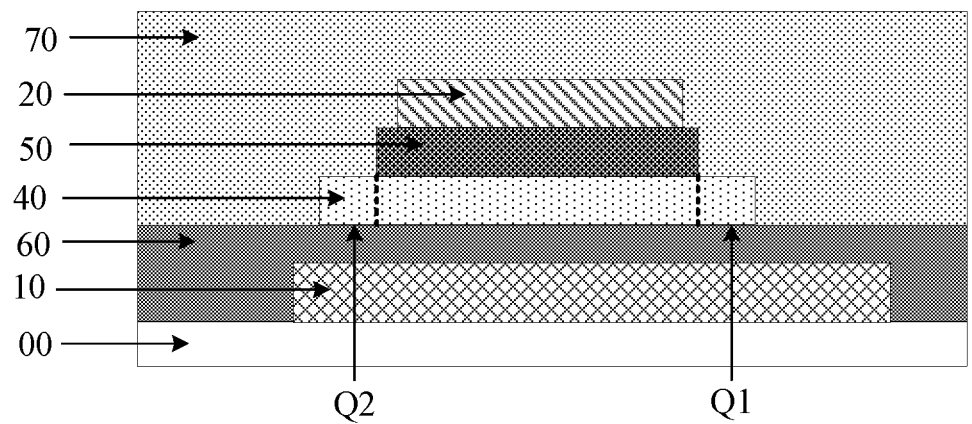
FIG. 14 is a structural schematic diagram of a base substrate formed with an interlayer dielectric layer according to some embodiments of the present disclosure.

In example embodiments, for the base substrate 00 on which the interlayer dielectric layer 70 is formed, reference is made to the structure shown in FIG. 14.

In step 705, a first source pattern and a first drain pattern are formed on the side of the interlayer dielectric layer away from the first gate metal layer.

Optionally, after the interlayer dielectric layer is formed, a first source/drain metal layer is formed on the side of the interlayer dielectric layer away from the first gate metal layer through the deposition process, and the first source/drain metal layer is processed through the patterning process to acquire the first source pattern and the first drain pattern.

Figure 15:
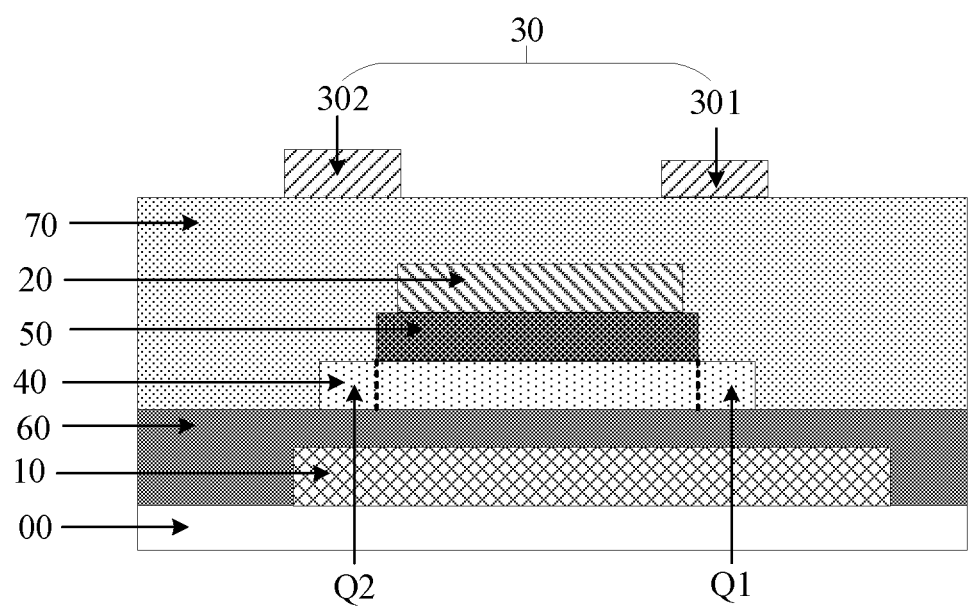
FIG. 15 is a structural schematic diagram of a base substrate formed with a first source/drain metal layer according to some embodiments of the present disclosure.

In example embodiments, for the base substrate 00 on which the first source pattern 301 and the first drain pattern 302 are formed, reference is made to the structure shown in FIG. 15.

In step 706, a passivation layer is formed on the side, away from the interlayer dielectric layer, of the first source pattern and the first drain pattern.

Optionally, after the first source pattern and the first drain pattern are formed, the passivation layer is formed on the side, away from the interlayer dielectric layer, of the first source pattern and the first drain pattern still through the deposition process.

Figure 16:
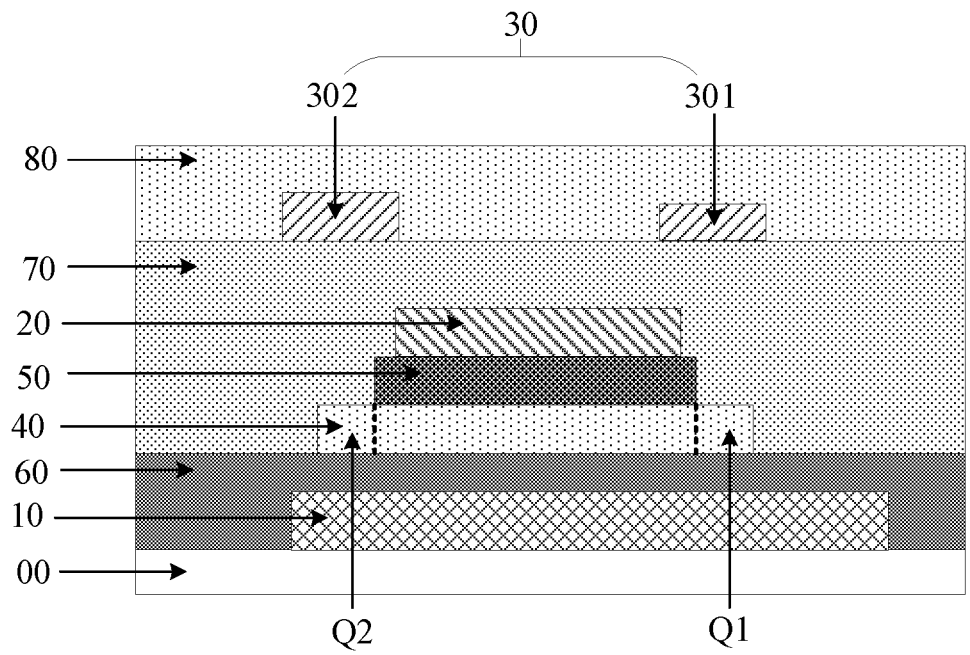
FIG. 16 is a structural schematic diagram of a base substrate formed with a passivation layer according to some embodiments of the present disclosure.

In example embodiments, for the base substrate 00 on which the passivation layer 80 is formed, reference is made to the structure shown in FIG. 16.

In step 707, a first via hole exposing the first light-shielding layer is formed in the passivation layer, the interlayer dielectric layer and the buffer layer.

Optionally, after the base substrate with the structure shown in FIG. 16 is acquired, photoresist is coated, and the first via hole exposing the first light-shielding layer is formed through an exposure process.

In step 708, a second via hole exposing the first gate metal layer is formed in the passivation layer and the interlayer dielectric layer.

Optionally, for the method for forming the second via hole, reference is made to the descriptions of step 707, and details are not repeated here.

In addition, a third via hole exposing the first conductive region Q1 and a fourth via hole exposing the second conductive region Q2 are formed in the interlayer dielectric layer still using the method of step 707.

Figure 17:
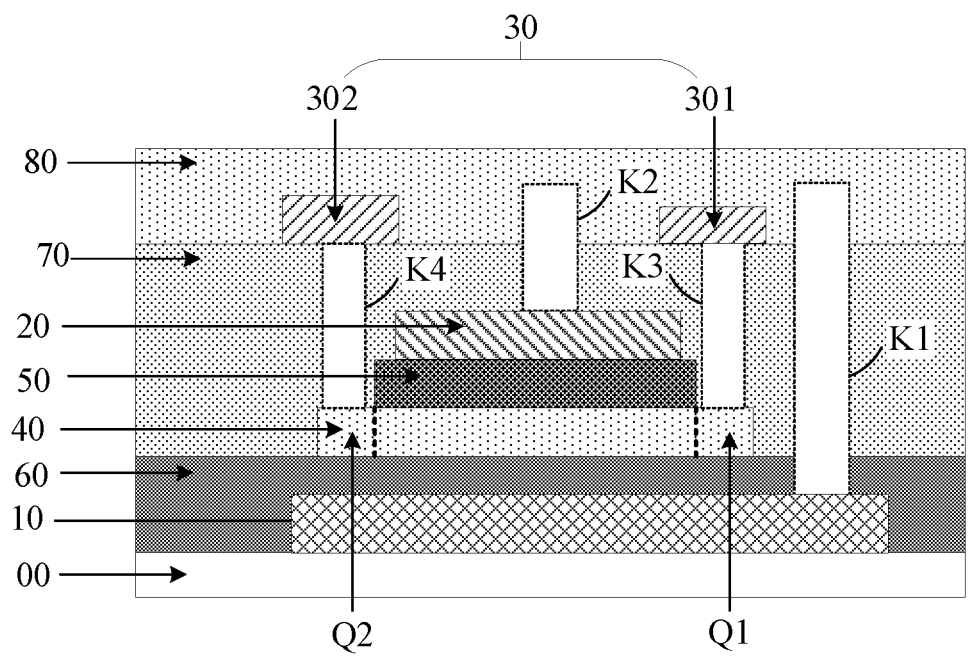
FIG. 17 is a structural schematic diagram of a base substrate formed with a via hole according to some embodiments of the present disclosure.

In example embodiments, for the base substrate 00 on which the first via hole K1, the second via hole K2, the third via hole K3 and the fourth via hole K4 are formed, reference is made to the structure shown in FIG. 17.

In step 709, a first connection portion is formed on the side of the passivation layer away from the base substrate, the first connection portion is connected to the first light-shielding layer through the first via hole and is connected to the first gate metal layer through the second via hole.

Finally, the first connection portion is formed, and the first connection portion is connected to the first light-shielding layer and the first gate metal layer through the first via hole and the second via hole, respectively. Moreover, a second connection portion is formed, and the second connection portion is connected to the first source pattern and the first conductive region through a third via hole, and a third connection portion is formed, and the third connection portion is connected to the first drain pattern and the second conductive region through a fourth via hole. Optionally, each connection portion is made of a conductive material, for example, metal.

Figure 18:
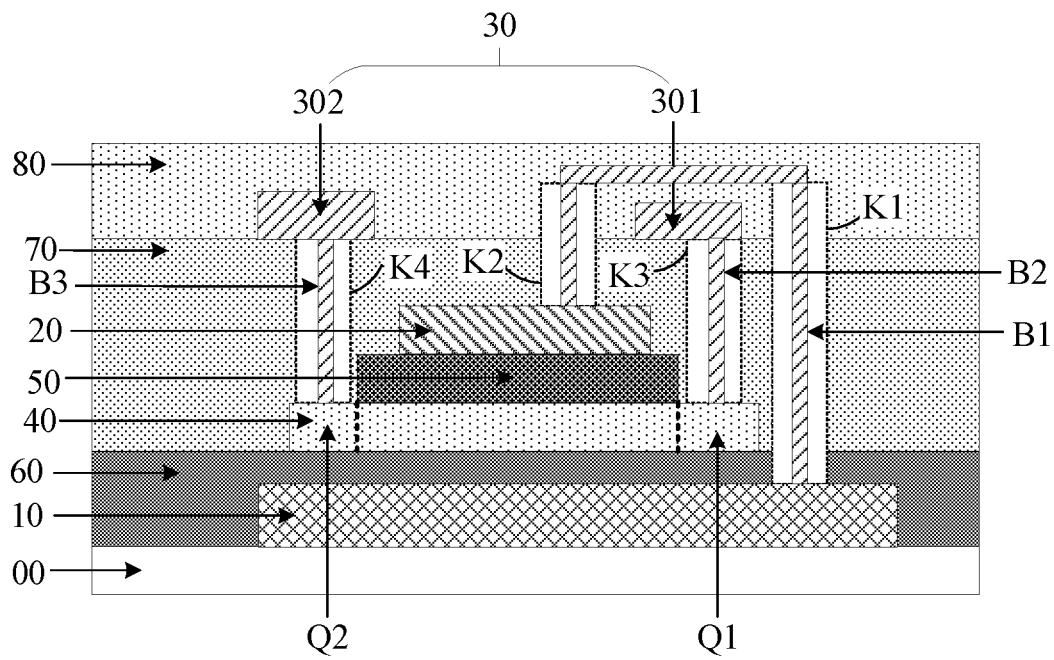
FIG. 18 is a structural schematic diagram of a base substrate formed with a connection portion according to some embodiments of the present disclosure.

In example embodiments, for the base substrate 00 on which the first connection portion B1, the second connection portion B2 and the third connection portion B3 are formed, reference is made to the structure shown in FIG. 18.

It should be noted that, the order of the steps of the manufacturing method provided by the embodiments of the present disclosure is appropriately adjusted, and the steps are also correspondingly added or deleted according to situation. For example, the via holes is formed first, then the source pattern and drain pattern is formed, and finally the passivation layer is formed. Within the technical scope disclosed by the present disclosure, any variations of the method easily derived by those skilled in the art shall be included in the protection scope of the present disclosure, and details are not repeated.

In summary, the embodiments of the present disclosure provide a method for manufacturing a gate driving circuit. By providing the first light-shielding layer and arranging the first light-shielding layer to be connected to the first gate metal layer, two conductive channels can be formed, and the on-state current can be increased, thereby effectively suppressing the negative voltage of the threshold voltage of transistors in the gate driving circuit.

Figure 19:
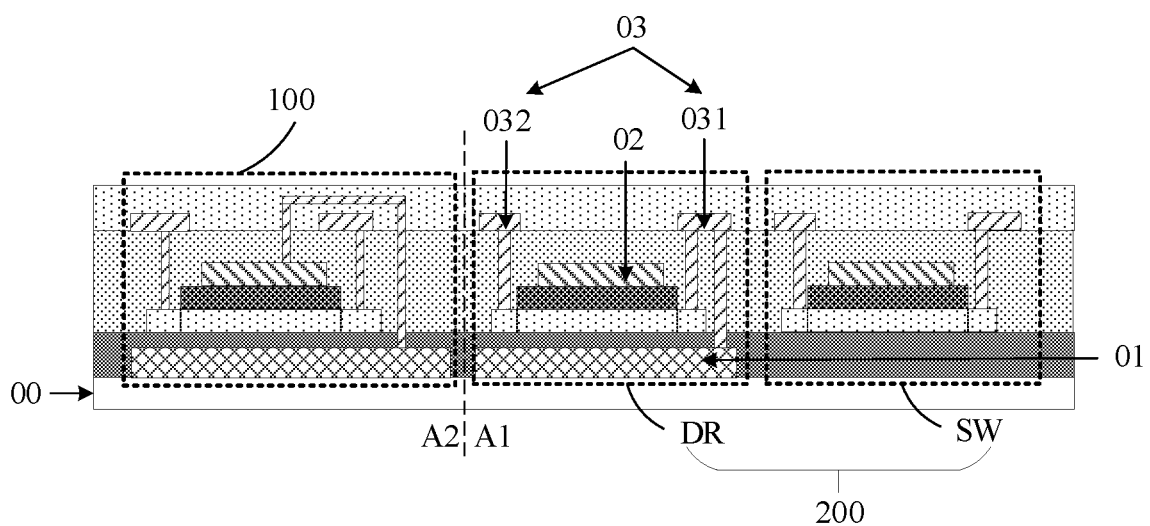
FIG. 19 is a structural schematic diagram of an array substrate according to some embodiments of the present disclosure.

FIG. 19 is a structural schematic diagram of an array substrate according to some embodiments of the present disclosure. As shown in FIG. 19, the array substrate includes a base substrate 00 provided with a display region A1 and a non-display region A2 surrounding the display region A1, a gate driving circuit 100 disposed in the non-display region A2, and a plurality of pixel circuits 200 disposed in the display region A1. The gate driving circuit 100 is as shown in any of FIG. 1, FIG. 2, FIG. 4 and FIG. 5. Each pixel circuit 200 includes a plurality of second transistors.

At least one second target transistor in the plurality of second transistors includes a second light-shielding layer 01, a second gate metal layer 02 and a second source/drain metal layer 03 sequentially laminated on a side of the base substrate 00. The second light-shielding layer 01 is made of a conductive material (e.g., metal), and the second source/drain metal layer 03 includes a second source pattern 031 and a second drain pattern 032, and the second light-shielding layer 01 is connected to the second source pattern 031.

Optionally, still referring to FIG. 19, the pixel circuit 200 shown includes a switch transistor SW and a drive transistor DR, and the second target transistor including the second light-shielding layer 01 is the drive transistor DR.

It should be noted that, for the method for manufacturing the second target transistor in the pixel circuit 200, reference is made to the method shown in FIG. 7, and details are not described herein again. In addition, FIG. 19 only shows the structure of one first target transistor in the gate driving circuit 100, and does not show the structures of other transistor.

Figure 20:
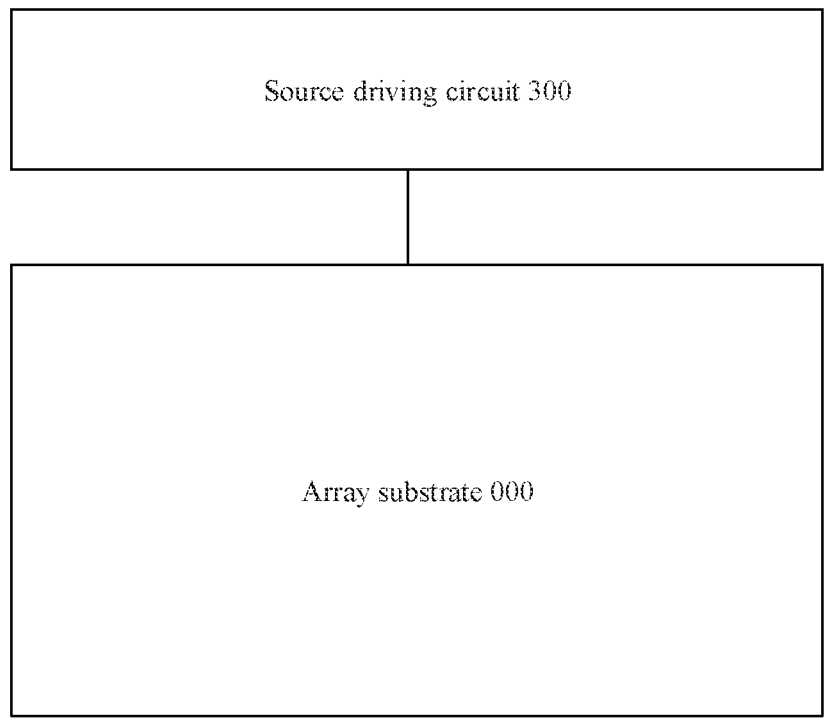
FIG. 20 is a structural schematic diagram of display device according to some embodiments of the present disclosure.

FIG. 20 is a structural schematic diagram of a display device according to some embodiments of the present disclosure. As shown in FIG. 20, the display device includes a source driving circuit 300 and the array substrate 000 as shown in FIG. 19.

The source driving circuit 300 is connected to a data line in the array substrate 000, and the source driving circuit 300 is configured to provide a data signal for the data line. In this way, under the drive of the above-described gate driving circuit 100 and the source driving circuit 300, pixels in the array substrate 000 can reliably emit light.

Optionally, the display device is any product or component with a display function, such as an organic light-emitting diode display device, a liquid crystal display device, a mobile phone, a computer, a television, a display, an electronic paper, a digital photo frame, a navigator, or the like.

It should be understood that "and/or" in this specification indicates three kinds of relationships. For example, A and/or B is expressed that A exists alone, A and B exist concurrently, and B exists alone. The character "/" generally indicates that the associated objects are an "or" relationship.

Described above are merely optional embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. A gate driving circuit, comprising: a plurality of first transistors; wherein at least one first target transistor of the plurality of first transistors comprises:

a first light-shielding layer disposed on a side of a base substrate, the first light-shielding layer being made of a conductive material;

a first gate metal layer and a first source/drain metal layer disposed on a side of the first light-shielding layer away from the base substrate, wherein the first light-shielding layer is connected to the first gate metal layer;

an active layer and a gate insulating layer, wherein the active layer, the gate insulating layer, the first gate metal layer, and the first source/drain metal layer are sequentially laminated along a direction away from the first light-shielding layer; and a buffer layer, an interlayer dielectric layer, and a passivation layer; wherein the buffer layer is disposed between the first light-shielding layer and the active layer; the interlayer dielectric layer is disposed between the first source/drain metal layer and the first gate metal layer; and the passivation layer is disposed on a side of the first source/drain metal layer away from the interlayer dielectric layer;

wherein the passivation layer, the buffer layer, and the interlayer dielectric layer are provided with a first via hole therein; the passivation layer and the interlayer dielectric layer are further provided with a second via hole therein; and the at least one first target transistor further comprises: a first connection portion; wherein the first connection portion is connected to the first light-shielding layer through the first via hole, and is connected to the first gate metal layer through the second via hole.

2. The gate driving circuit according to claim 1, wherein the conductive material is a metal material.

3. The gate driving circuit according to claim 1, wherein a thickness of the first light-shielding layer is greater than a thickness threshold.

4. The gate driving circuit according to claim 1, wherein the plurality of first transistors comprise: an input transistor, a reset transistor, a first output transistor, a second output transistor, a first pull-down control transistor, a second pull-down control transistor, a third pull-down control transistor, a fourth pull-down control transistor, a fifth pull-down control transistor, a first pull-down transistor, a second pull-down transistor, a third pull-down transistor, and a fourth pull-down transistor; wherein a gate and a first electrode of the input transistor are connected to an input terminal, and a second electrode of the input transistor is connected to a pull-up node;

a gate of the first output transistor is connected to the pull-up node, a first electrode of the first output transistor is connected to a first clock signal terminal, and a second electrode of the first output transistor is connected to a shift output terminal;

a gate of the second output transistor is connected to the pull-up node, a first electrode of the second output transistor is connected to a second clock signal terminal, and a second electrode of the second output transistor is connected to a driving output terminal;

a gate of the reset transistor is connected to a reset signal terminal, a first electrode of the reset transistor is connected to a first pull-down power supply terminal, and a second electrode of the reset transistor is connected to the pull-up node;

a gate and a first electrode of the first pull-down control transistor are both connected to a pull-down power supply terminal, and a second electrode of the first pull-down control transistor is connected to a gate of the second pull-down control transistor;

a first electrode of the second pull-down control transistor is connected to the pull-down control power supply terminal, and a second electrode of the second pull-down control transistor is connected to a pull-down node;

a gate of the third pull-down control transistor and a gate of the fourth pull-down control transistor are both connected to the pull-up node, and a first electrode of the third pull-down control transistor and a first electrode of the fourth pull-down control transistor are both connected to the first pull-down power supply terminal, a second electrode of the third pull-down control transistor is connected to the gate of the second pull-down control transistor, and a second electrode of the fourth pull-down control transistor is connected to the pull-down node;

a gate of the fifth pull-down control transistor is connected to a shift output terminal of another cascaded gate driving circuit, a first electrode of the fifth pull-down control transistor is connected to the first pull-down power supply terminal, and a second electrode of the fifth pull-down control transistor is connected to the pull-down node;

a gate of the first pull-down transistor, a gate of the second pull-down transistor and a gate of the third pull-down transistor are all connected to the pull-down node, a first electrode of the first pull-down transistor and a first electrode of the second pull-down transistor are both connected to the first pull-down power supply terminal, a first electrode of the third pull-down transistor is connected to a second pull-down power supply terminal, a second electrode of the first pull-down transistor is connected to the pull-up node, a second electrode of the second pull-down transistor is connected to the shift output terminal, and a second electrode of the third pull-down transistor is connected to the driving output terminal; and a gate of the fourth pull-down transistor is connected to a shift output terminal of another gate driving circuit, a first electrode of the fourth pull-down transistor is connected to the first pull-down power supply terminal, and a second electrode of the fourth pull-down transistor is connected to the pull-up node.

5. The gate driving circuit according to claim 4, wherein the gate driving circuit further comprises a storage capacitor, one end of the storage capacitor is connected to the pull-up node, and the other end of the storage capacitor is connected to the driving output terminal.

6. The gate driving circuit according to claim 4, wherein the at least one first target transistor comprises at least one of: the second output transistor, the second pull-down transistor or the third pull-down transistor.

7. The gate driving circuit according to claim 6, wherein the conductive material is a metal material; and a thickness of the first light-shielding layer is greater than a thickness threshold;

the at least one first target transistor further comprises: an active layer and a gate insulating layer; wherein the active layer, the gate insulating layer, the first gate metal layer and the first source/drain metal layer are sequentially laminated along a direction away from the first light-shielding layer;

an orthographic projection of the first light-shielding layer on the base substrate covers an orthographic projection of the active layer on the base substrate;

the at least one first target transistor further comprises: a buffer layer, an interlayer dielectric layer and a passivation layer; wherein the buffer layer is disposed between the first light-shielding layer and the active layer; the interlayer dielectric layer is disposed between the first source/drain metal layer and the first gate metal layer; and the passivation layer is disposed on a side of the first source/drain metal layer away from the interlayer dielectric layer;

the passivation layer, the buffer layer and the interlayer dielectric layer are provided with a first via hole therein; the passivation layer and the interlayer dielectric layer are further provided with a second via hole therein; and the at least one first target transistor further comprises: a first connection portion, wherein the first connection portion is connected to the first light-shielding layer through the first via hole, and is connected to the first gate metal layer through the second via hole; and the active layer comprises a first conductive region and a second conductive region; the interlayer dielectric layer is provided with a third via hole and a fourth via hole therein; the first source/drain metal layer comprises a first source pattern and a first drain pattern; and the at least one first target transistor further comprises: a second connection portion and a third connection portion, wherein one end of the second connection portion is connected to the first source pattern, and the other end of the second connection portion is connected to the first conductive region through the third via hole; and one end of the third connection portion is connected to the first drain pattern, and the other end of the third connection portion is connected to the second conductive region through the fourth via hole.

8. The gate driving circuit according to claim 6, wherein the first light-shielding layer is connected to the gate of the second output transistor, the gate of the second pull-down transistor and the gate of the third pull-down transistor.

9. The gate driving circuit according to claim 1, wherein an orthographic projection of the first light-shielding layer on the base substrate covers an orthographic projection of the active layer on the base substrate.

10. The gate driving circuit according to claim 1, wherein the active layer comprises a first conductive region and a second conductive region; the interlayer dielectric layer is provided with a third via hole and a fourth via hole therein; the first source/drain metal layer comprises a first source pattern and a first drain pattern; and the at least one first target transistor further comprises: a second connection portion and a third connection portion; wherein one end of the second connection portion is connected to the first source pattern, and the other end of the second connection portion is connected to the first conductive region through the third via hole; and one end of the third connection portion is connected to the first drain pattern, and the other end of the third connection portion is connected to the second conductive region through the fourth via hole.

11. A method for manufacturing a gate driving circuit, comprising:

forming a first light-shielding layer on a side of a base substrate by using a conductive material;

forming a first gate metal layer and a first source/drain metal layer on a side of the first light-shielding layer away from the base substrate, wherein the first light-shielding layer is connected to the first gate metal layer;

forming a buffer layer, an active layer, and a gate insulating layer sequentially on the side of the first light-shielding layer away from the base substrate, prior to forming the first gate metal layer on the side of the first light-shielding layer away from the base substrate;

forming an interlayer dielectric layer on a side of the first gate metal layer away from the base substrate, after forming the first gate metal layer on the side of the first light-shielding layer away from the base substrate;

forming a passivation layer on a side of the first source/drain metal layer away from the interlayer dielectric layer, after forming the first source/drain metal layer on the side of the first light-shielding layer away from the base substrate;

forming a first via hole exposing the first light-shielding layer in the passivation layer, the interlayer dielectric layer and the buffer layer;

forming a second via hole exposing the first gate metal layer in the passivation layer and the interlayer dielectric layer; and forming a first connection portion on a side of the passivation layer away from the base substrate, wherein the first connection portion is connected to the first light-shielding layer through the first via hole, and is connected to the first gate metal layer through the second via hole.

12. An array substrate, comprising:

a base substrate, provided with a display region and a non-display region surrounding the display region;

a gate driving circuit disposed in the non-display region, and a plurality of pixel circuits disposed in the display region, wherein the gate driving circuit comprises: a plurality of first transistors; wherein at least one first target transistor of the plurality of first transistors comprises:

a first light-shielding layer disposed on a side of a base substrate, the first light-shielding layer being made of a conductive material;

a first gate metal layer and a first source/drain metal layer disposed on a side of the first light-shielding layer away from the base substrate, wherein the first light-shielding layer is connected to the first gate metal layer;

an active layer and a gate insulating layer, wherein the active layer, the gate insulating layer, the first gate metal layer, and the first source/drain metal layer are sequentially laminated along a direction away from the first light-shielding layer; and a buffer layer, an interlayer dielectric layer, and a passivation layer; wherein the buffer layer is disposed between the first light-shielding layer and the active layer; the interlayer dielectric layer is disposed between the first source/drain metal layer and the first gate metal layer; and the passivation layer is disposed on a side of the first source/drain metal layer away from the interlayer dielectric layer;

wherein the passivation layer, the buffer layer, and the interlayer dielectric layer are provided with a first via hole therein; the passivation layer and the interlayer dielectric layer are further provided with a second via hole therein; and the at least one first target transistor further comprises: a first connection portion; wherein the first connection portion is connected to the first light-shielding layer through the first via hole, and is connected to the first gate metal layer through the second via hole.

13. A display device, comprising: a source driving circuit and the array substrate as defined in claim 12; wherein the source driving circuit is connected to a data line in the array substrate, and the source driving circuit is configured to provide a data signal for the data line.

14. The array substrate according to claim 12, wherein each of the pixel circuits comprises a plurality of second transistors, and at least one second target transistor in the plurality of second transistors comprises: a second light-shielding layer, a second gate metal layer and a second source/drain metal layer sequentially laminated on a side of the base substrate, wherein the second light-shielding layer is made of a conductive material, and the second source/drain metal layer comprises a second source pattern and a second drain pattern, the second light-shielding layer being connected to the second source pattern.

15. The array substrate according to claim 14, wherein the plurality of second transistors comprise: a switch transistor and a drive transistor; wherein the at least one second target transistor comprises the drive transistor.

16. The array substrate according to claim 12, wherein a thickness of the first light-shielding layer is greater than a thickness threshold.

* * * * *